United States Patent
Van Empel et al.

(10) Patent No.: US 7,978,339 B2
(45) Date of Patent: Jul. 12, 2011

(54) LITHOGRAPHIC APPARATUS TEMPERATURE COMPENSATION

(75) Inventors: Tjarko Adriaan Rudolf Van Empel, Eindhoven (NL); Marcel Hendrikus Maria Beems, Veldhoven (NL); Emiel Jozef Melanie Eussen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 352 days.

(21) Appl. No.: 11/242,130

(22) Filed: Oct. 4, 2005

(65) Prior Publication Data

US 2007/0076218 A1    Apr. 5, 2007

(51) Int. Cl.
*G01B 9/02* (2006.01)

(52) U.S. Cl. .................................................. 356/500

(58) Field of Classification Search .................. 356/500, 356/517, 486, 493, 498; 355/30
See application file for complete search history.

(56) References Cited

U.S. PATENT DOCUMENTS

| | | | | |
|---|---|---|---|---|
| 4,710,604 A | * | 12/1987 | Shirasu et al. | 219/121.78 |
| 5,877,843 A | * | 3/1999 | Takagi et al. | 355/30 |
| 5,920,392 A | * | 7/1999 | Tsai et al. | 356/498 |
| 5,991,033 A | * | 11/1999 | Henshaw et al. | 356/487 |
| 6,529,279 B2 | * | 3/2003 | de Groot et al. | 356/517 |
| 7,079,252 B1 | * | 7/2006 | Debreczeny et al. | 356/451 |
| 7,326,931 B2 | * | 2/2008 | Frodl et al. | 250/343 |

FOREIGN PATENT DOCUMENTS

| | | |
|---|---|---|
| JP | 61-258423 A | 11/1986 |
| JP | 1-120021 A | 5/1989 |
| JP | 3-129720 A | 6/1991 |
| JP | 9-082625 A | 3/1997 |
| JP | 9-186065 A | 7/1997 |
| JP | 2000-031040 A | 1/2000 |
| JP | 2002-353095 A | 12/2002 |
| JP | 2004-228383 A | 8/2004 |
| JP | 02005345298 A | * 12/2005 |

OTHER PUBLICATIONS

W.T. Estler, "High-accuracy displacement interferometry in air," Applied Optics vol. 24, No. 6 (Mar. 15, 1985), pp. 808-815.*
Notification of Reasons for Refusal for Japanese Patent Application No. 2006-266141 mailed Sep. 1, 2009, 4 pgs.

* cited by examiner

*Primary Examiner* — Hwa S. A Lee
(74) *Attorney, Agent, or Firm* — Sterne, Kessler, Goldstein & Fox P.L.L.C.

(57) ABSTRACT

A lithographic apparatus includes a position measurement system to determine along a measurement path a position of a first part of the lithographic apparatus with respect to a position of a second part of the lithographic apparatus. The position determination system comprises a plurality of temperature sensors to measure a temperature of a medium along the measurement path. The position measurement system corrects the determined position making use of the temperature as measured by the temperature sensors.

5 Claims, 3 Drawing Sheets

LITHOGRAPHIC APPARATUS TEMPERATURE COMPENSATION

BACKGROUND

1. Field of the Invention

The invention relates to a lithographic apparatus comprising a position measurement system and a method to determine a position of a first part of a lithographic apparatus with respect to a position of a second part of the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) of a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An ongoing development in lithography is that dimensions of patterns to be applied onto the substrate are reduced year by year to be able to provide, e.g., integrated circuits having a higher degree of integration (i.e., more memory cells or processing capacity per square mm of chip area) and/or a higher bandwidth, i.e., a higher processing speed or a lower access time. Also, in the case of a substrate comprising, e.g., a liquid crystal display panel, smaller pattern sizes will support a higher resolution of the display panel and other design requirements. One of the factors to be able to achieve such high accuracies, and to be able to apply multiple layers of patterns onto the substrate which match with each other, is that alignments in the lithographic apparatus have to fulfill more and more stringent accuracy requirements. Such alignments may include, e.g., alignments of various parts of the lithographic apparatus with respect to each other, e.g., an alignment of a substrate table holding a substrate with respect to the projection system, an alignment of a mask table holding a mask with respect to the substrate table holding the substrate, an alignment of the mask table holding the mask with respect to the projection system, as well as many other examples. A common principle in such alignments is that relative positions are determined, i.e., a position of a first part is determined with respect to a position of a second part. The smaller a size of a pattern to be applied onto the substrate, the higher the requirements on the accuracy of the alignment. In current and future generations of lithographic apparatuses, alignment accuracies of better than 1 nanometer may be aimed at. Attempting to achieve such accuracies, sensitivities for a variety of environmental conditions become extremely high: temperature fluctuations (e.g., due to electric dissipation by electronics, motors, lasers, etc.) may result in, e.g., expansion of constructions in the lithographic apparatus and/or expansion of gasses in the lithographic apparatus or other effects on the measurement system. Furthermore, pressure fluctuations (e.g., due to shocks, movements, etc.) may result in small displacements of portions of the lithographic apparatus or have other effects on the measurement system, etc. A further aspect which plays a role here is that frequently use is made of optical detectors such as interferometers and encoders to measure in a contactless way a distance between various elements or parts of the lithographic apparatus. As an example, when aligning a first part of the lithographic apparatus to a second part of the lithographic apparatus, optical detectors may be applied to measure a position of the first part with respect to a reference, while further optical detectors are applied to measure a position of the second part with respect to the reference. From these positions as measured, a relative position of the first part with respect to the second part may be derived, which information may be used to perform the alignment. A complicating factor here is that in particular interferometers perform a measurement with an outcome that is in some way dependent on a wavelength of an optical beam applied by the interferometer (such a laser source thereof). A wavelength of the beam is however, due to physical laws, dependent on various environmental conditions, such as a temperature and a pressure of the medium (such as a gas) through which the beam travels, but also carbon dioxide concentration and relative humidity. Therefore, also pressure of the medium through which the beam travels will affect a wavelength of the beam. Therefore, temperature, pressure fluctuations, etc., not only influence structures of the lithographic apparatus (such as elements of the first and second parts), but may also affect outcomes of measurements by sensors, such as optical measurement devices. Pressure fluctuations may also result in, e.g., refractive index variations which may lead to position measurement errors. In addition to the above, not only temperature and pressure changes have an effect on an accuracy of measurements in the lithographic apparatus, also changes in humidity, in composition of gas mixtures (e.g., $CO_2$ concentration) and many other examples will have an effect thereupon.

As an example, assume that a part of the lithographic apparatus, e.g., a mounting of a lens comprises a radius of 250 mm. Assume that this part comprises a steel having a thermal expansion coefficient of 12 ppm/K. Then, an expansion of 3 µm per degree centigrade results. Thus, when a desired accuracy is in an order of magnitude of 1 nanometer or better, a temperature fluctuation of 0.33 mK may be allowed at maximum. In practical implementations however, local or global temperature fluctuations or changes which may be orders of magnitudes larger, have been observed. Achieving a temperature stability up to a degree of 0.33 mK is therefore considered problematic, in fact virtually impossible in a current lithographic apparatus. Furthermore in an alignment various parts of the lithographic apparatus may play a role, and therefore the allowable budget in tolerance of 1 nanometer may have to be divided over a plurality of parts, thus tightening the above temperature stability requirements even further.

SUMMARY

It is desirable to provide a lithographic apparatus and method enabling highly accurate position measurements and/or alignments.

According to an embodiment of the invention, there is provided a lithographic apparatus to transfer a pattern from a patterning device onto a substrate, including a position measurement system to determine along a measurement path a position of a first part of the lithographic apparatus with respect to a position of a second part of the lithographic apparatus, the position measurement system including a plurality of sensors to measure a physical parameter of a medium along the measurement path, the position measurement system to correct the determined position for the measured physical parameter of the medium.

In another embodiment of the invention, there is provided a method to determine a position of a first part of a lithographic apparatus with respect to a position of a second part of the lithographic apparatus, the method including determining along a measurement path the position of the first part of the lithographic apparatus with respect to the position of the second part of the lithographic apparatus, and measuring by a plurality of sensors a physical parameter of a medium along the measurement path; and correcting the determined position for the measured physical parameter of the medium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
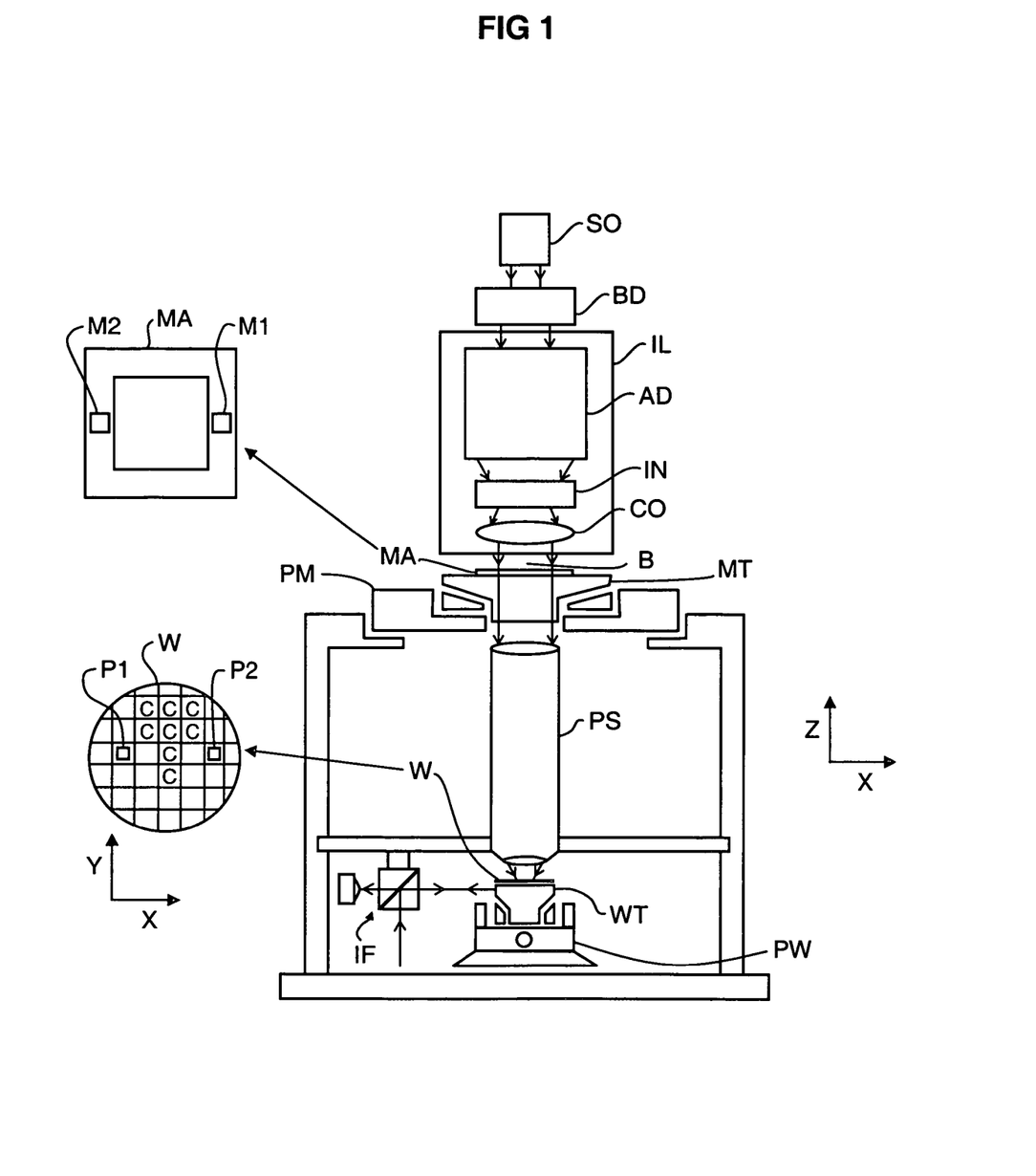
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
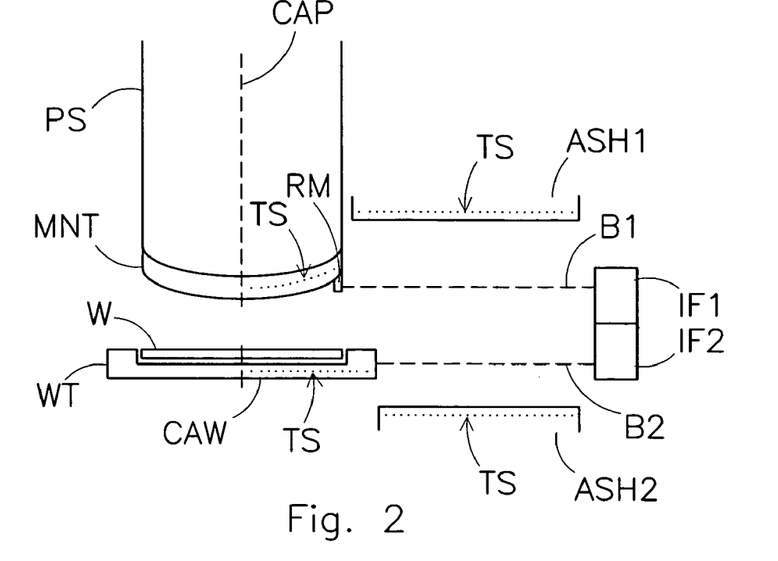
FIG. 2 a part of a lithographic apparatus according to an aspect of the invention.

FIG. 2 shows a substrate W held by a substrate table WT. A projection system PS is provided to project a beam of radiation onto the substrate W. Further, a first interferometer IF1 is depicted which measures by means of a measurement beam B1 a distance towards a reference mirror RM. A second interferometer IF2 measures by means of a measurement beam B2 a distance towards the substrate table WT. As interferometer IF1 and interferometer IF2 are mechanically connected directly or indirectly to each other, a combination of the distances determined by the first and second interferometers IF1, IF2 provides a measure for a relationship of the position of the projection system PS to the position of the substrate table WT holding the substrate W, interferometers IF1 and IF2 forming part of a position measurement system to measure a position of the projection system (or more precisely a center axis thereof) and the substrate table. Further, FIG. 2 depicts air showers ASH1 and ASH2 which each provide a stream of a gas (e.g. air, nitrogen. or any other suitable gas) towards an area through which the respective measurement beams B1, B2 travel. Also, it may be possible that both beams are conditioned by one and the same air shower.

Assume now that an optical center axis CAP of the projection system PS is to be aligned with respect to a center axis CAW of the substrate W. Thereto, the first interferometer IF1 provides a distance between the interferometer IF1 and the reference mirror RM which is connected to the projection system PS, while the second interferometer IF2 provides a distance between that interferometer and the substrate table WT (or more in particular a right side of the substrate table WT seen in the plane of drawing of FIG. 2). Now adding a distance between the center axis CAW of the substrate table and the edge thereof on which the beam B2 reflects, as well as a distance between the center axis CAP of the projection system PS and the reference mirror RM, into the alignment, a relationship between the respective center axis CAP and CAW may be determined. Now, between the center axis CAP of the projection system and the center axis CAW of the substrate W a measurement path has been established, the path extending from the center axis CAP of the projection system, via the projection system PS, and in particular via a mounting MNT of a downstream lens thereof, to the reference mirror RM, via de measurement beam B1 to the first interferometer IF1, then to the second interferometer IF2, via de measurement beam B1 to the right side (as seen in the plane of drawing of FIG. 2) of the substrate table WT and then from the right side of the substrate table WT via de substrate table to the center axis CAW. Also, a position of the substrate W with respect to the substrate table WT may have to be taken into account. A problem which comes forward now, as described above, is a sensitivity for environmental changes such as a change in temperature or a change in pressure (or other parameters such as humidity, chemical composition etc.). Structures in the measurement path such as the mounting MNT of the projection system PS, or the substrate table WT may show expansion effects due to temperature changes or other effects, while a wavelength of the measurement beams B1, B2 also depends on a temperature (or pressure or other effects), these effects resulting in a sensitivity towards the temperature, pressure etc.) of the position as determined making use of the respective interferometer. According to an aspect of the invention, temperature sensors TS are provided, along at least a part of the measurement path. In this example, temperature sensors TS are provided in the mounting MNT, in a relevant part of the substrate table WT, as well as along nozzles of the air showers ASH1, ASH2 thus sensing a temperature of the gas flowing out of the respective nozzles. The inventors have devised that small temperature changes may occur in a structure e.g. the mounting MNT of the substrate table WT. These small temperature differences may be in an order of magnitude of mK, however also larger or smaller temperature differences may be imaginable. To be able to take account of these temperature differences, a plurality of temperature sensors TS are provided along the path, in this example a plurality of temperature sensors in the mounting MNT as well as in the substrate table WT, as well as a plurality of sensors along the nozzles. As for the nozzles, it is possible that a temperature sensor is provided for each nozzle, however also plural temperature sensors per nozzle are imaginable as well as a temperature sensor per group of nozzles. The inventors have devised that a spacing between the temperature sensors of 5 centimeters may provide adequate results, however the higher requirements on accuracy the smaller the spacing between the temperature sensors may be. Each of the temperature sensors TS may be read out individually (e.g. by means of a separate read out circuit), however it is also possible that the temperature sensors are multiplexed (thus, e.g., read out one after the other), reducing an amount of read out electronics to be required or according to a further aspect of the invention, the temperature sensors may be connected at least partly in series. By connecting a group of temperature sensors in series, an adding of resistance values thereof is obtained which provides for an averaging effect of the resistance value thereof and thus an averaging effect of a temperature measured. Thus, by connecting (groups of) the temperature sensor in series, it is not only possible to reduce a complexity of read out electronics required, but also to reduce a processing thereof, as averaging is already provided by the putting in series. A further advantage of the series connection is that a gain (i.e. a change in resistance value versus a change in temperature) of the series connection of sensors may be increased, a signal to noise ratio may be improved, a lower self heating per sensor may be achieved due to the series connection and a heating of the sensors may be better spread in the medium. Furthermore, the effects mentioned here may be achieve with components that have favorable characteristics such as negative temperature coefficient (NTC) resistors having a nominal resistance value of approximately 10 kOhms. NTC's around this nominal resistance value show a low amount of noise and a high sensitivity, thereby making use thereof favorable. Instead of or in addition to the negative temperature coefficient resistors as described here, positive temperature coefficient resistors or any other type of temperature sensors may be used too, an example thereof being semiconductor sensors. Furthermore, temperature dependent resistors may also be connected in a so called Wheatstone bridge connection to increase a gain and to reduce resistor noise.

In addition to the series connection described above, it is also possible that the sensors are connected in a series parallel connection, comprising, e.g., parallel chains of series connected sensors. Thereby, an averaging effect is achieved as described above, providing the advantage that a total impedance value of the sensors thus connected is reduced by the parallel connection of the chains of series connected resistors.

Another example where the idea as described here may be applied is when measuring a position of the substrate table with an interferometer, the position of the table being measured thereby with respect to the metrology frame of the lithographic apparatus. A thermal expansion of the metrology frame with respect to the center axis of the projection system CAP may now be taken into account by measuring a temperature of the metrology frame similarly to described above.

Figure 3:
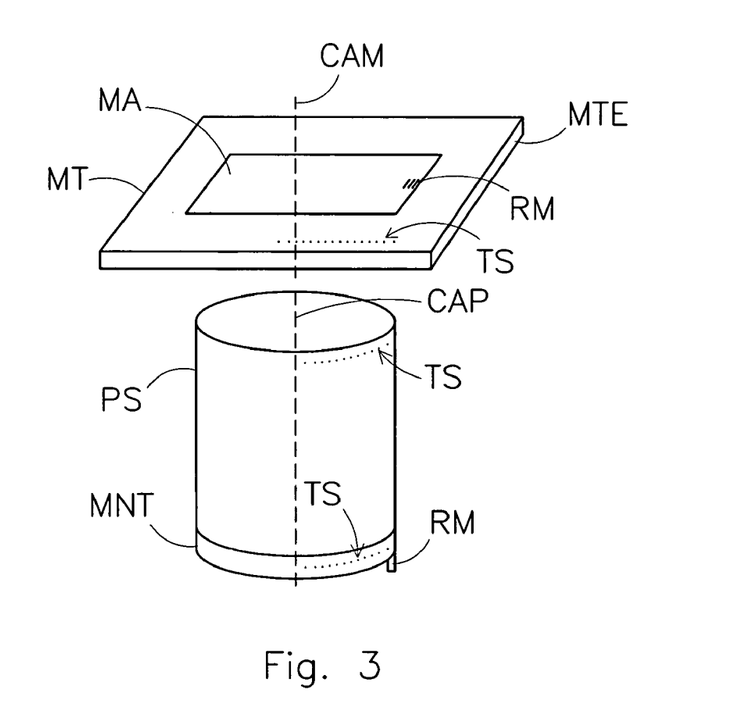
FIG. 3 depicts a part of a lithographic apparatus according to a further aspect of the invention.

FIG. 3 depicts the projection system PS and the mask table MT holding a mask MA. Also here if an alignment of the projection system PS with respect to the mask MA held by the mask table MT is to be performed, a similar problem as described above with reference to FIG. 2 plays a role, i.e., effects of environmental conditions along a measurement path. In this example, a center axis CAM of the mask MA held by the mask table MT is to be aligned with respect to the center axis CAP of the projection system PS. As an example, a position of an edge MTE of the mask table MT is measured by means of an optical sensor (such as an encoder or an interferometer). The position of the projection system PS may be determined by means of the distance measurements towards the reflective mirror RM as described above with reference to FIG. 2. Also, it is imaginable that other types of measurements are applied, it is e.g. possible that an optical measurement measures a position of a marker on the mask table MT or on the mask MA with respect to a marker connected to the projection system. Thereto, it is possible that a measurement beam is sent through the projection system and the mask MA, the beam interacting with the respective markers. Also, it may be possible that a reflective mirror or reflective grid is connected to a side of the mask table MT facing the projection system PS, a measurement beam through the projection system PS or parts thereof reflecting on the said mirror. Still further (as may be the case in a present lithographic apparatus), it is possible that e.g. an encoder head is connected to a lens or lens mount of the projection system, the encoder head facing a grating on the mask table. In these examples it is desired to align the center axis CAP of the projection system to the center axis CAM of the mask MA held by the mask table MT. The position of the projection system and the position of the mask MA held by the mask table MT are to be derived from a position of the reference mirror RM for the projection system and from, e.g., a position of markers, e.g., at an edge of the projection system and/or the substrate, etc., for the mask MA held by the mask table MT. The position measurements by any of the above examples of a position measurement system to measure a position of the mask M with respect to the projection system (or more precisely a center axis thereof) are thus performed making use of a reference (a mirror, marker, grating, etc.) which does not coincide with the center axis CAM, CAP. Also here, temperature sensor may be provided to. measure a temperature along such measurement path or a part thereof. For example, when a reference mark RM on the mask table MT is used which faces the protection system, in combination with a reference mark RM on the projection system (e.g., at an edge of an upstream lens or downstream lens of the projection system), a plurality of temperature sensor TS in the mask table and a plurality of temperature sensors TS in the mounting MNT of the projection lens may be applied to determine a temperature in a part of the mask table MT and/or the mounting MNT which is in a path between the center axis CAM of the mask MA and the reference mark RM on the mask table and/or a path between the center axis CAP and the reference marker on a lens of the projection system PS. Thereby, expansion of the mask table MT and/or the mounting MNT of the projection system may be taken into account in a direction parallel to the X-axis as drawn in FIG. 3. In this example, the markers are in line with the center axis CAM and/or CAP in a direction parallel to the Y-axis, thus obviating a need to perform a correction in that direction. The reference markers RM may comprise any suitable marker, comprising, e.g., a grid, a plurality of parallel lines, etc., and may be reflective, transmissive, etc.

For the embodiment as may be applied with the current lithographic apparatus a similar situation occurs. The encoder head on the projection system determines a position of the grating connected to the mask table. Here, the encoder head is mounted to a side of the projection system thus not coinciding with the center axis of the projection system. The encoder head may face the mask table. Also, the grating on the mask table may be located outside an optical window of the mask table, and therefore not coincide with the center axis of the mask. The gratings may face the projection system. Therefore, the measurement path in this case comprises a distance from the encoder head to the center axis of the projection system as well as a distance from the grating to the center axis of the mask as both the grating and the encoder head are offset from the respective central axes. In current implementations, both the position of the encoder head and the position of the grating are offset from the respective center axes in X direction. As an example, the encoder head may be mounted to a top right most side of the FIG. 3 projection system, and the grating may be mounted to a right side of the mask table MT in the view of FIG. 3, the grating facing the encoder head, thereby being able to cooperate with the encoder head. Therefore according to the invention a measurement of a temperature of a path along a part of the projection system (e.g. along a part of the mounting of the upstream lens thereof similarly to what has been depicted in FIG. 3) and along a part of the mask table similarly to what has been depicted in FIG. 3, may be desirable. Thereby, a temperature along a path along the projection system and the mask table may be measured which path corresponds to an offset between the center axes of the mask table and the grating in X direction, and/or an offset in X direction between and the center axis of the projection system and the encoder head. The temperature measurement allows for a correction of any material expansion along the path due to temperature effects, thereby enabling to correct a length of the path (in this example a length in X-dimension due to the offset in X direction). Further, as described above, temperature sensors to measure a temperature in the gas through which the encoder beam travels, may be applied also.

In addition to or instead of the measurement system comprising optical sensors as depicted in and described with reference to FIGS. 2 and 3, other types of position sensors may be applied, e.g., capacitive position sensors, etc. The capacitive sensor may, e.g., measure a distance between a part or structure (e.g., the substrate table) and the reference frame or other reference structure, such as a metrology frame. In that case, a similar correction mechanism may be applied: Capacitive measurements are generally sensitive to a change in dielectric constant, which is mainly a function of relative humidity. Therefore, humidity sensors may be positioned along a path of the capacitive sensors.

In general, the concept described here may be applied to correct any measurement for an effect by any physical parameter, the physical parameter may comprise, e.g., a temperature, a pressure, a relative humidity, and/or a carbon dioxide concentration, and the measurement system may comprise a corresponding one of a temperature measurement system, a pressure measurement system, a relative humidity measurement system and a carbon dioxide measurement system.

Figure 4:
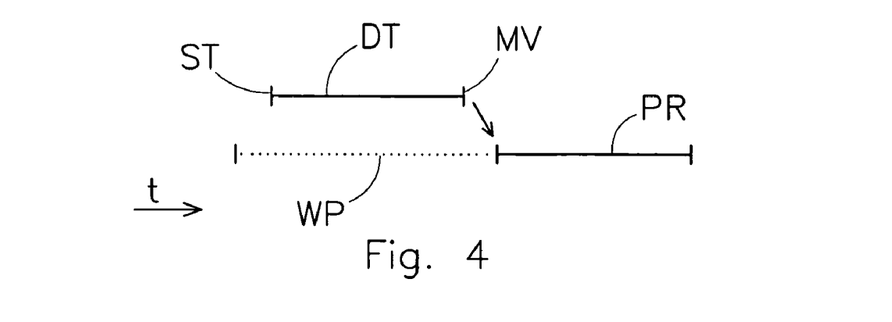
FIG. 4 depicts a timing diagram illustrating a lithographic apparatus and a method according to a still further aspect of the invention.

FIG. 4 depicts a timing diagram to explain a further aspect of the invention. It is not uncommon that a measurement value (e.g., of a pressure sensor or a temperature sensor, a relative humidity sensor, a carbon dioxide concentration sensor) is only available after a delay time as of a start of a measurement. The delay time may be due to an averaging of a measurement value over a certain time span, however also a processing by, e.g., read-out electronics, data processing devices, etc., may play a role. A process which makes use of the measurement value is now faced with a delay, firstly because of a delay between the measurement and the availability of the measurement value, and secondly because the process which makes use of the measurement value may be a-synchronous with the availability of the measurement value. Therefore, the measurement value may already be available for some time, thus introducing effectively an additional delay between the availability of the measurement value and the start of the process. All these delays result in an inaccuracy, as a time between the actual measurement and the moment in time at which the measurement value is taken into account by the process, increases. Therefore, fluctuations, changes, gradients, etc. of the physical value which is represented by the measurement value, may not be taken into account or may be taken into account to late. This problem may be solved by an aspect of the invention which is explained with reference to FIG. 4. FIG. 4 shows a start ST of a measurement process to obtain a measurement value MV. After a delay time DT from the start ST, the measurement value MV becomes available. According to an aspect of the invention, a process PR is started upon availability of the measurement value Mv. A start of the process PR may thus be impeded (e.g. during the waiting period WP) until the measurement value MV becomes available.

Figure 5:
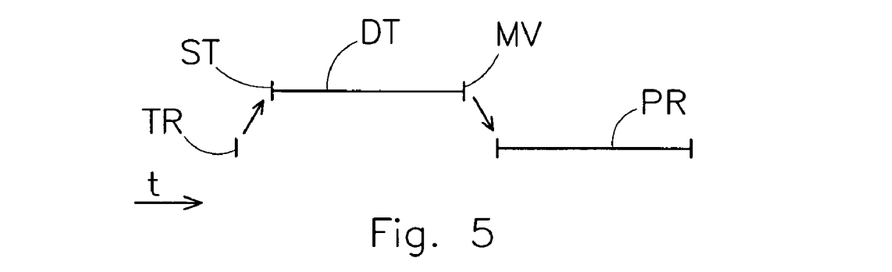
FIG. 5 depicts a timing diagram illustrating a lithographic apparatus and a method according to another aspect of the invention.

An alternative way to solve the problem as described above with reference to FIG. 4, will now be described with reference to FIG. 5. In FIG. 5, before performing the process, a trigger TR is provided to start the determining of the measurement value. The trigger TR triggers a start ST of a measurement, which after a delay time DT provides the measurement value MV. The process PR now starts at a moment in time which is at least the delay time DT after the trigger, thus the process starting when the measurement value MV has become available. Commonly, it is known at which moment in time the process PR is to start, e.g., at periodic intervals. As these moments in time are known on beforehand, a trigger may be easily determined which is at least the delay time before the scheduled start of the process PR. Using this trigger, the determination of the measurement value may be started to make available the measurement value at the scheduled start of the process PR. In the examples described with reference to FIGS. 4 and 5, the measurement system may comprise a temperature measurement system, a pressure measurement system, or any other type of measurement system. The process may e.g., comprise an alignment process, however any other process may be imaginable too. As an example, the sensor may comprise a pressure sensor which comprises a crystal oscillator having a crystal whose resonance frequency responds to a change in pressure. A frequency of the oscillator provides thus a measure for the pressure to which the crystal is subjected. Read-out electronics integrate the frequency of the oscillator over an integration time. A delay of a processing to process the integrated frequency, the integration time, as well as other delays caused by, e.g., data transport, processing, etc. result a delay time in making available the measurement value. Additional delay may, as described above, be introduced in that a process which makes use of the measurement value, such as in this example the pressure, is asynchronous with the making available of the measurement value, hence introducing additional delay. In the example of the pressure sensor described here, the measurement value provided by the pressure measurement is used in an alignment. The measurement performed in respect of the alignment (e.g., the measuring of a distance by an interferometer) is now performed at a moment in time when the measurement value of the pressure measurement becomes available. Thus, the measuring by the interferometer (which in this example thus forms part of the process) is synchronized to the making available of the pressure measurement value. In order to prevent a huge amount of delay due to the synchronizing of the process to the making available of the measurement value, it is possible that only in case of a critical measurement or critical process the synchronization as described with reference to FIG. 4 is performed. It is remarked that the alternative embodiment as described with reference to FIG. 5 may be performed without introducing such additional delays, as a trigger is provided before the process is started to make the measurement value available just before the scheduled start of the process. The above may also be applied in case of illuminating the substrate. As an example, it is possible to provide a trigger to perform a pressure measurement some time before a stationary speed of the substrate table has been achieved, i.e., before the moment in time at which illumination of a part of the substrate starts. Thereby, it is ensured that the measurement value representative of the pressure becomes available at the start of the illumination of the part of the substrate.

Figure 6:
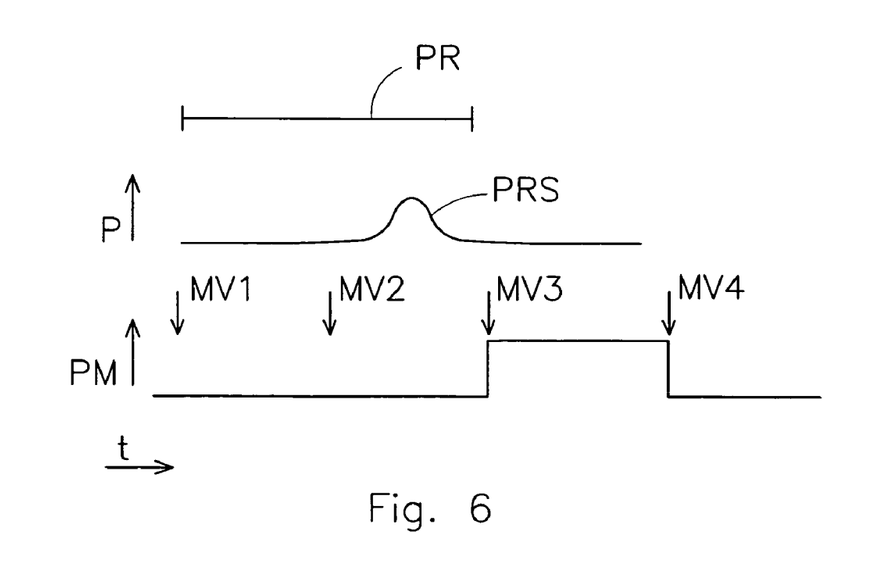
FIG. 6 depicts a timing diagram illustrating a lithographic apparatus and a method according to still another aspect of the invention.

A further aspect of the invention will now be described with reference to FIG. 6. FIG. 6 shows a timing diagram in which a process PR is performed in the lithographic apparatus. The process may be the same as the one described with reference to FIGS. 4 and 5, however also other processes are imaginable. Examples thereof will be provided below. The lithographic apparatus also comprises a measurement system to measure a parameter, such as a physical quantity. A problem which now occurs is that sudden changes in the value of the parameter may only reflect at a later moment in time in the measurement value, due to delays in the measurement system caused by, e.g., integration, filtering, delays in data processing, etc., in case however that a process is sensitive to the parameter, an undesired effect may have taken place in the process by the change of the physical parameter, while the measurement value has not yet reflected such change during the performing of the process. Therefore, errors may come forward as the outcome of the process may not be corrected for the change in the parameter. As an example, the process may comprise an alignment, while the parameter comprises a pressure. The inventors have devised that sudden changes in pressure, e.g. due to an opening or closing of a door of a room in which the lithographic apparatus is located, or other shocks or disturbances may result in sudden pressure fluctuations which may affect an accuracy of the alignment. Due to however the transient nature of the pulses, and the delays in the measurement of the pressure, a change in the measurement value may occur after the alignment has been performed, or at a moment in time when the alignment has already been started. According to an aspect of the invention, the process (thus in this example the alignment) may now be redone in case that a change of the measurement value (thus in this example a change of the pressure as indicated by the measurement value) exceeds a predetermined threshold during the performing of the process or in a time window thereafter taking account of the delay time of the measurement system to measure the parameter. Thus in this example, in case that after completion of the alignment, it appeared that the threshold has risen, it is determined if the change in the measurement value exceeded a predetermined threshold, and if this is the case, then the alignment is repeated. Thereby, it is thus made possible to take into account sudden fluctuations of a to be measured parameter, even with a measurement system which comprises a delay time, or which has a too low bandwidth to be able to detect the changes in due time. The measurement may not only comprise a pressure measurement, however the principle described here may be applicable to any other measurement, e.g., a temperature measurement, etc. The above example is schematically depicted in FIG. 6: in the timing diagram shown in FIG. 6, the process PR is performed and curve PRS indicates a pressure. Measurement values are obtained at the moments in time indicated with MV1, MV2, MV3, etc., and an outcome of the measurement, i.e., in this example the pressure measurement is indicated with PM, thus representing a value of the most recent measurement. The pressure curve PRS shows a pressure change during the performing of the process PR (e.g., a disturbance due to a shock, etc.). An effect of the pressure change will only be available at MV3, as due to the delays as described above, the fluctuation did not reflect in a substantial change at MV2. As described above, the change in the measurement value from MV2 to MV3 may now be compared with a threshold, and if exceeding the threshold, the process (thus in this example the alignment) may be repeated again. In this example the comparing of the change in the measurement value is then making use of a difference between MV3 and MV2, however it is also imaginable that a plurality of measurement values are taken into account to determine if a disturbance has occurred.

It is remarked that the principles as described with reference to FIGS. 4, 5 and 6 may be applied in a lithographic apparatus according to the invention, such as described with reference to FIGS. 2 and 3, however these principles may also be applied in general with any lithographic apparatus thereby providing one of more of the advantages as described.

In the embodiments as described with reference to FIGS. 4, 5 and 6, use may be made also of multiple sensors, each having its own delay. In the FIG. 4 case, the waiting period should be sufficiently long to make all required updated sensor results available. In the FIG. 5 case, each sensor should be provided with its own trigger to make results by the respective sensor available at the start of the process. In the FIG. 6 case, the delay times of the various sensors should be taken into account, thus the process is to be redone in case that a change in the respective parameter during performing the process of within the delay time for that sensor thereafter, exceeds a predetermined threshold, or in case that a weighted sum of each of the changes in the respective parameters (during performing the process of within the respective delay time for each of the sensors thereafter) exceeds a predetermined threshold.

The embodiments as described with reference to FIGS. 4-6 may not only be applied with a temperature measurement system or pressure measurement system, however may also be used with a relative humidity measurement system and/or a carbon dioxide measurement system achieving same of similar effects as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method to determine an actual position of a first part of a lithographic apparatus with respect to a position of a second part of the lithographic apparatus, the method comprising:
    measuring along a first measurement path a position of the first part of the lithographic apparatus relative to a first measurement device of the lithographic apparatus, the first measurement path being between a first source and receiver of the first measuring device and the first part of the lithographic apparatus;
    measuring along a second measurement path a position of the second part of the lithographic apparatus relative to a second measurement device of the lithographic apparatus, the second measurement path being between a second source and receiver of the second measuring device and the second part of the lithographic apparatus
    measuring, by a first plurality of sensors located along nozzles of an air shower along the first and second measurement paths, a temperature of a gas flowing out of the respective nozzles;
    measuring, by a second plurality of sensors located along the first and second measurement paths, a physical parameter of a medium along the first and second measurement paths; and
    correcting the measured relative position of the first part with respect to the second part by taking into account the measured temperature of the gas and the measured physical parameter of the medium in order to determine the actual position of the first part with respect to the second part.

2. The method of claim 1, further comprising:
    starting, upon availability of the measured physical parameter, a process which uses the measured physical parameter.

3. The method of claim 1, further comprising:
    triggering, before a scheduled start of a process which uses the measured physical parameter, a performing of a physical parameter measurement; and
    making available to the process the measured physical parameter at the scheduled start of the process.

4. The method of claim 1, further comprising:
    performing a process which is sensitive to the physical parameter; and
    re-performing the process when a change in the physical parameter during the performing of the process or within a delay time thereafter exceeds a predetermined threshold for the physical parameter.

5. The method of claim 1, further comprising:
    conditioning at least one of the first and second measurement path with a shower.

* * * * *

UNITED STATES PATENT AND TRADEMARK OFFICE
CERTIFICATE OF CORRECTION

PATENT NO.       : 7,978,339 B2
APPLICATION NO.  : 11/242130
DATED            : July 12, 2011
INVENTOR(S)      : Tjarko Adriaan Rudolf Van Empel It is certified that error appears in the above-identified patent and that said Letters Patent is hereby corrected as shown below:

Column 14, line 24 insert -- ; -- after "apparatus".

Signed and Sealed this
Thirtieth Day of August, 2011

David J. Kappos
*Director of the United States Patent and Trademark Office*